(12) United States Patent
Jimma

(10) Patent No.: US 8,586,446 B2
(45) Date of Patent: Nov. 19, 2013

(54) MANUFACTURING METHOD OF SEMICONDUCTOR DEVICE

(75) Inventor: Yuuko Jimma, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 13/233,354

(22) Filed: Sep. 15, 2011

(65) Prior Publication Data

US 2012/0202323 A1 Aug. 9, 2012

(30) Foreign Application Priority Data

Feb. 8, 2011 (JP) ................................ 2011-024864

(51) Int. Cl.
*H01L 21/76* (2006.01)

(52) U.S. Cl.
USPC .................. 438/413; 438/270; 257/E21.411; 257/E21.218

(58) Field of Classification Search
USPC ...................... 216/55, 62; 438/426, 413, 270; 257/E21.411, E21.218
See application file for complete search history.

(56) References Cited

U.S. PATENT DOCUMENTS

| 2004/0238881 | A1* | 12/2004 | Ozawa | 257/316 |
| 2006/0046428 | A1* | 3/2006 | Baiocco et al. | 438/425 |
| 2009/0176339 | A1* | 7/2009 | Cheng et al. | 438/242 |

FOREIGN PATENT DOCUMENTS

| JP | 11-103033 | 4/1999 |
| JP | 2004-349650 | 12/2004 |
| JP | 2006-80484 | 3/2006 |
| JP | 2006-86486 | 3/2006 |
| JP | 2007-59812 | 3/2007 |
| JP | 2009-302116 | 12/2009 |

\* cited by examiner

*Primary Examiner* — Caridad Everhart
(74) *Attorney, Agent, or Firm* — Oblon, Spivak, McClelland, Maier & Neustadt, L.L.P.

(57) ABSTRACT

According to one embodiment, a silicon film, in which an impurity density of a center portion is higher than that of an upper portion and a lower portion, is formed above a base layer, a mask pattern is formed above the silicon film, a recess is formed in the silicon film by selectively etching the silicon film through the mask pattern, a silicon oxide film is formed on a surface of the recess by an oxidation process of the silicon film, and the silicon film under the recess is etched through the mask pattern after the oxidation process.

20 Claims, 5 Drawing Sheets

MANUFACTURING METHOD OF SEMICONDUCTOR DEVICE

CROSS-REFERENCE TO RELATED APPLICATIONS

This application is based upon and claims the benefit of priority from the prior Japanese Patent Application No. 2011-24864, filed on Feb. 8, 2011; the entire contents of which are incorporated herein by reference.

FIELD

Embodiments described herein relate generally to a manufacturing method of a semiconductor device.

BACKGROUND

In semiconductor devices, a polycrystalline silicon film is used for a gate electrode or the like in some cases. With the recent scaling of semiconductor devices, it is gradually becoming difficult to form a gate electrode, which has a processed shape in which a sidewall is vertical to a substrate, by anisotropic etching.

Moreover, for example, when forming a floating gate electrode of a NAND flash memory using a silicon film, a doping amount of an impurity is modulated along a film thickness direction of the silicon film in some cases. In such a case, because the etching rate of the silicon film is different depending on a doping amount of an impurity, a constriction is sometimes formed in the center portion in the film thickness direction when processing the silicon film. Such a constriction becomes a factor of generating a void in an embedding process of a dielectric film after processing the silicon film.

DETAILED DESCRIPTION

In general, according to a manufacturing method of a semiconductor device of embodiments, a silicon film, in which an impurity density of a center portion is higher than that of an upper portion and a lower portion, is formed above a base layer. Next, a mask pattern is formed above the silicon film. Next, a recess is formed in the silicon film by selectively etching the silicon film through the mask pattern. Next, a silicon oxide film is formed on a surface of the recess by an oxidation process of the silicon film. Next, the silicon film under the recess is etched through the mask pattern.

A manufacturing method of a semiconductor device according to the embodiments will be explained below with reference to the drawings. The present invention is not limited to these embodiments.

First Embodiment

FIG. 1A to FIG. 3A and FIG. 1B to FIG. 3B are cross-sectional views illustrating a manufacturing method of a semiconductor device according to the first embodiment.

Figure 1A:
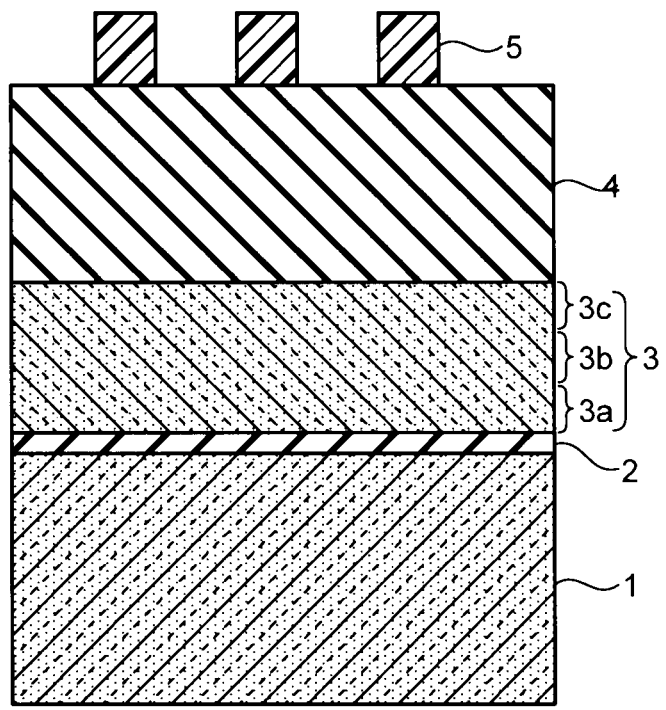
FIG. 1A and FIG. 1B are cross-sectional views illustrating a manufacturing method of a semiconductor device according to a first embodiment.

In FIG. 1A, a polycrystalline silicon film 3 is formed on a semiconductor substrate 1 via a dielectric film 2. As a material of the semiconductor substrate 1, for example, Si, Ge, SiGe, SiC, SiSn, PbS, GaAs, InP, InGaAsP, GaP, GaN, or ZnSe can be used.

As the dielectric film 2, for example, a silicon oxide film can be used. This dielectric film 2 may be used as a tunnel oxide film or a gate oxide film.

The polycrystalline silicon film 3 may be used as a floating gate electrode of a NAND flash memory or the like or may be used as a gate electrode of a field-effect transistor or the like. Moreover, an amorphous silicon film may be used instead of the polycrystalline silicon film 3.

The upper portion and the lower portion of the polycrystalline silicon film 3 are formed of non-doped layers 3a and 3c, respectively, and the center portion of the polycrystalline silicon film 3 is formed of a doped layer 3b. As an impurity of the doped layer 3b, for example, P, B, or As can be used. Moreover, the upper portion and the lower portion of the polycrystalline silicon film 3 may be formed of doped layers whose impurity density is lower than the center portion of the polycrystalline silicon film 3. The impurity density profile of the polycrystalline silicon film 3 may change stepwise between the upper portion, the lower portion, and the center portion or may change continuously.

As a forming method of the non-doped layers 3a and 3c and the doped layer 3b, a source gas used when forming the polycrystalline silicon film 3 by the CVD may be changed. Alternatively, after forming a non-doped polycrystalline silicon film, the doped layer 3b may be formed by ion-implanting an impurity.

Then, a silicon oxide film 4 is formed on the polycrystalline silicon film 3 by a method such as the CVD. As the silicon oxide film 4, for example, a TEOS film can be used.

The upper portion of the polycrystalline silicon film 3 is formed of the non-doped layer 3c, so that the silicon oxide film 4 can be easily formed on the polycrystalline silicon film 3. Moreover, the center portion of the polycrystalline silicon film 3 is formed of the doped layer 3b, so that the resistance of the polycrystalline silicon film 3 can be reduced, enabling to facilitate writing of electrons when the polycrystalline silicon film 3 is used as a floating gate electrode. Furthermore, the lower portion of the polycrystalline silicon film 3 is formed of the non-doped layer 3a, so that when the polycrystalline silicon film 3 is used as a floating gate electrode, electrons are not easily removed.

Then, a resist pattern 5 is formed on the silicon oxide film 4 by the photolithography technology.

Figure 1B:
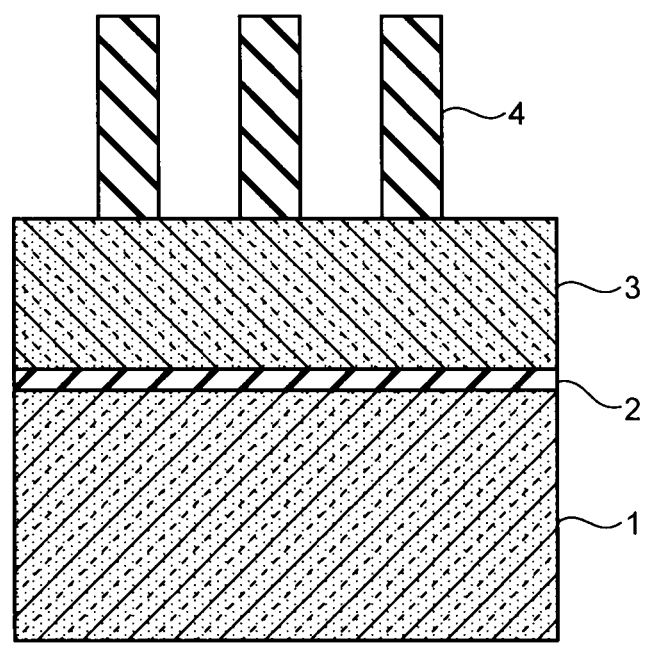

Next, as shown in FIG. 1B, the silicon oxide film 4 is patterned by etching the silicon oxide film 4 with the resist pattern 5 as a mask. Then, the resist pattern 5 is removed from the silicon oxide film 4 by a method such as ashing.

Figure 2A:
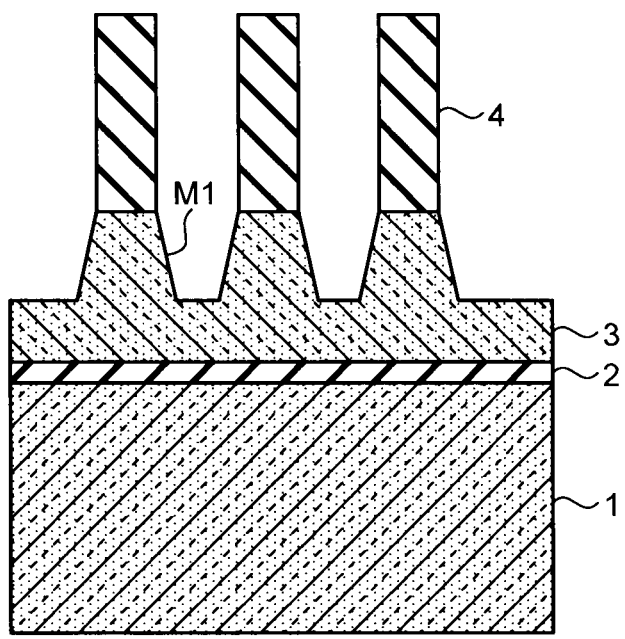
FIG. 2A and FIG. 2B are cross-sectional views illustrating the manufacturing method of the semiconductor device according to the first embodiment.

Next, as shown in FIG. 2A, recesses M1 are formed in the polycrystalline silicon film 3 by etching the polycrystalline silicon film 3 with the patterned silicon oxide film 4 as a mask. The depth of the recess M1 is preferably set so that the sidewall of the doped layer 3b is exposed.

Figure 2B:
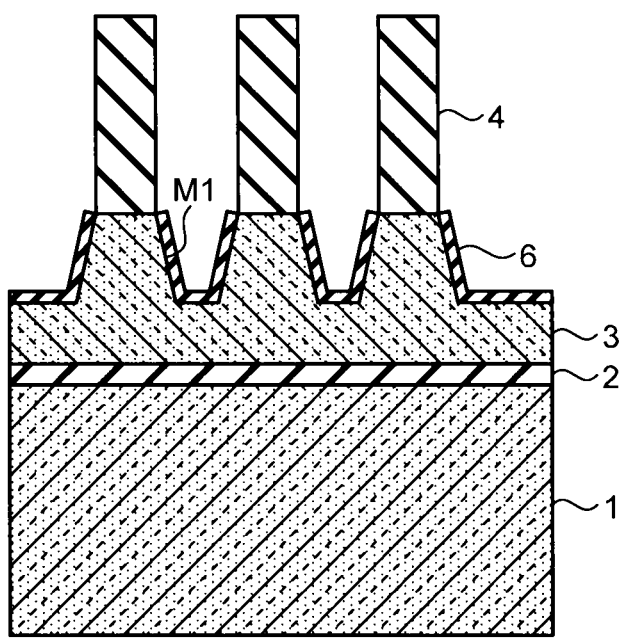

Next, as shown in FIG. 2B, a silicon oxide film 6 is formed on the surfaces of the recesses M1 by an oxidation process of the polycrystalline silicon film 3. As the oxidation process of the polycrystalline silicon film 3, a thermal oxidation of the polycrystalline silicon film 3 or a plasma oxidation of the polycrystalline silicon film 3 may be performed. The sidewall of the doped layer 3b can be covered with the silicon oxide film 6 by setting the depth of the recess M1 so that the sidewall of the doped layer 3b is exposed.

Figure 3A:
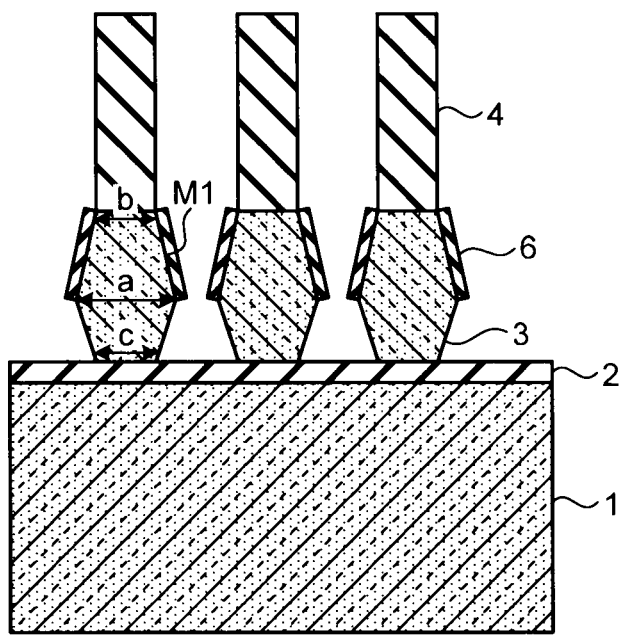
FIG. 3A and FIG. 3B are cross-sectional views illustrating the manufacturing method of the semiconductor device according to the first embodiment.

Next, as shown in FIG. 3A, after removing the silicon oxide film 6 formed on the bottom surfaces of the recesses M1 by anisotropic etching, the polycrystalline silicon film 3 is etched again with the patterned silicon oxide film 4 as a mask, thereby removing the polycrystalline silicon film 3 under the recesses M1. The etching removal of the silicon oxide film 6 on the bottom surfaces of the recesses M1 can be performed in the same etching chamber as the etching of the polycrystalline silicon film 3 without taking out the substrate from the chamber by appropriately changing the etching conditions. At this time, because the side surfaces of the recesses M1 are covered with the silicon oxide film 6, side etching of the polycrystalline silicon film 3 in the recesses M1 is prevented and side etching of the polycrystalline silicon film 3 under the recesses M1 proceeds.

Therefore, the width of the center portion of the polycrystalline silicon film 3 can be made larger than the widths of the upper portion and the lower portion thereof. In other words, the conditions a>b and a>c can be satisfied, where a is the width of the center portion of the polycrystalline silicon film 3, b is the width of the upper portion of the polycrystalline silicon film 3, and c is the width of the lower portion of the polycrystalline silicon film 3 when the polycrystalline silicon film 3 under the recesses M1 is removed.

Figure 3B:
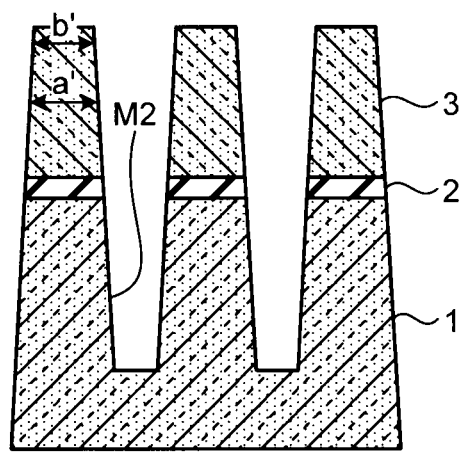

Next, as shown in FIG. 3B, trenches M2 are formed in the semiconductor substrate 1 by etching the dielectric film 2 and the semiconductor substrate 1 with the patterned silicon oxide film 4 as a mask. Thereafter, the silicon oxide film 4 is removed by etching.

When a silicon substrate is used as the semiconductor substrate 1, in a portion in which the polycrystalline silicon film 3 is exposed from the silicon oxide film 6 by the silicon oxide film 6 being removed at the time of etching of the dielectric film 2 or the like, the polycrystalline silicon film 3 is side-etched when forming the trenches M2 in the semiconductor substrate 1.

At this time, when the impurity density of the center portion of the polycrystalline silicon film 3 is higher than that of the upper portion and the lower portion thereof, the etching rate of the center portion of the polycrystalline silicon film 3 becomes higher than the upper portion and the lower portion, so that the center portion of the polycrystalline silicon film 3 is etched faster than the upper portion and the lower portion.

Before forming the trenches M2 in the semiconductor substrate 1, the width a of the center portion of the polycrystalline silicon film 3 is made larger than the widths b and c of the upper portion and the lower portion thereof, so that even when the center portion of the polycrystalline silicon film 3 is etched faster than the upper portion and the lower portion, the width of the center portion of the polycrystalline silicon film 3 can be prevented from becoming smaller than the width of the upper portion, enabling to prevent a constriction from being formed in the polycrystalline silicon film 3. In other words, the condition a'≥b' can be satisfied, where a' is the width of the center portion of the polycrystalline silicon film 3 and b' is the width of the upper portion of the polycrystalline silicon film 3 after forming the trenches M2 in the semiconductor substrate 1. The width a' of the center portion of the polycrystalline silicon film 3 after forming the trenches M2 in the semiconductor substrate 1 can be made smaller than the width of the lower portion of the polycrystalline silicon film 3.

When forming a NAND flash memory with the polycrystalline silicon film 3 as a floating gate electrode, an isolation dielectric film can be embedded in the trenches M2. Then, a control gate electrode film is formed on the polycrystalline silicon film 3 via an inter-electrode dielectric film and grooves orthogonal to the trenches M2 are formed in the control gate electrode film, the inter-electrode dielectric film, the polycrystalline silicon film 3, and the dielectric film 2, enabling to form memory cells.

Second Embodiment

FIG. 4A, FIG. 4B, FIG. 5A, and FIG. 5B are cross-sectional views illustrating a manufacturing method of a semiconductor device according to the second embodiment.

Figure 4A:
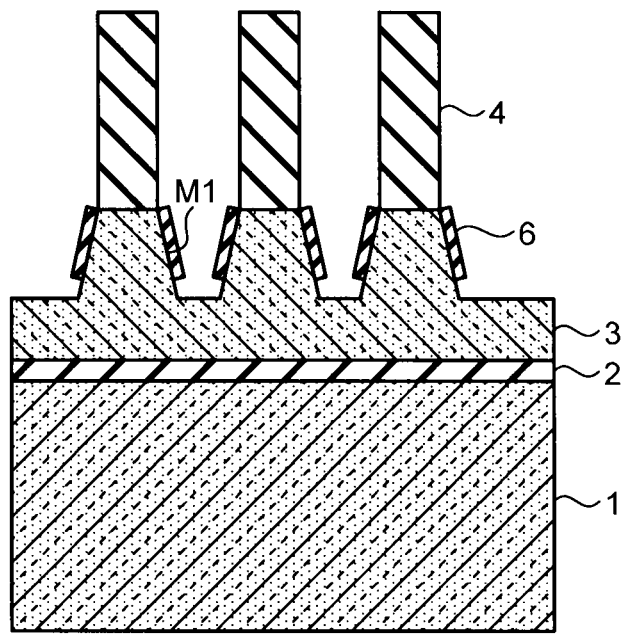
FIG. 4A and FIG. 4B are cross-sectional views illustrating a manufacturing method of a semiconductor device according to a second embodiment.

In FIG. 4A, after forming the recesses M1 in the polycrystalline silicon film 3 by the processes similar to FIG. 1A, FIG. 1B, and FIG. 2A, the silicon oxide film 6 is formed on the surfaces of the recesses M1 by the process similar to FIG. 2B. The depth of the recess M1 at this time may be made smaller than that of the recess M1 in FIG. 2A.

Then, after removing the silicon oxide film 6 formed on the bottom surfaces of the recesses M1 by anisotropic etching, the polycrystalline silicon film 3 is etched again with the patterned silicon oxide film 4 as a mask, thereby removing part of the polycrystalline silicon film 3 under the recesses M1 to increase the depth of the recesses M1.

Figure 4B:
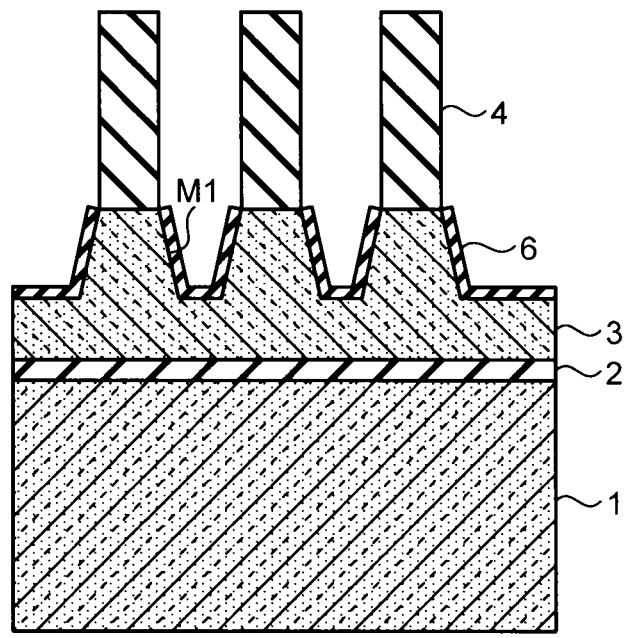

Next, as shown in FIG. 4B, the silicon oxide film 6 is formed on the surface of the polycrystalline silicon film 3 that is newly exposed in the recesses M1 by an oxidation process of the polycrystalline silicon film 3.

The processes in FIG. 4A and FIG. 4B may be repeated a plurality of times.

Figure 5A:
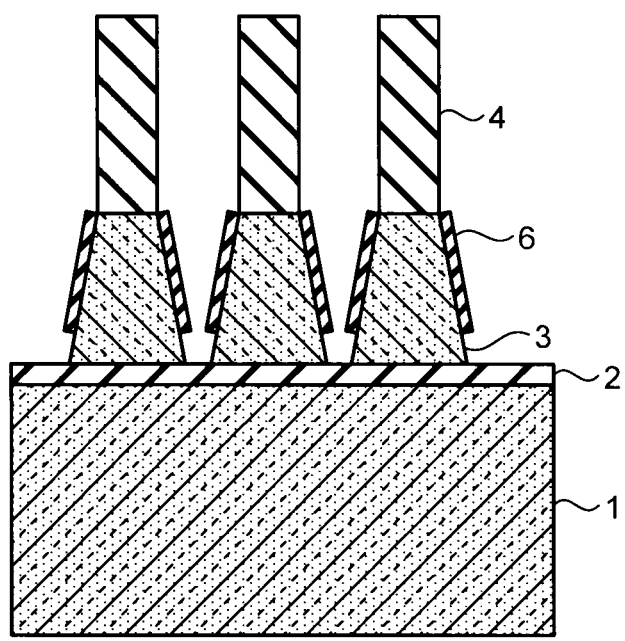
FIG. 5A and FIG. 5B are cross-sectional views illustrating the manufacturing method of the semiconductor device according to the second embodiment.

Next, as shown in FIG. 5A, after removing the silicon oxide film 6 on the bottom surfaces of the recesses M1 by anisotropic etching, the polycrystalline silicon film 3 is etched again with the patterned silicon oxide film 4 as a mask, thereby removing the polycrystalline silicon film 3 under the recesses M1.

Figure 5B:
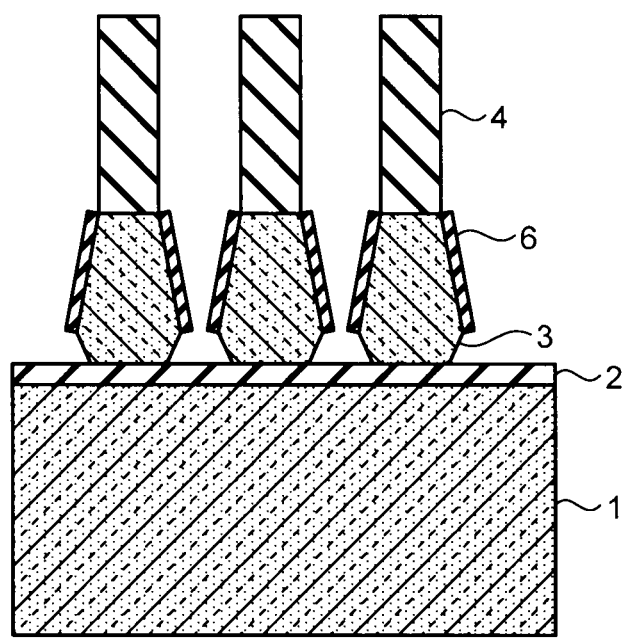

Next, as shown in FIG. 5B, in order to accommodate variations in timing of removing the polycrystalline silicon film 3 under the recesses M1 in the semiconductor substrate surface, overetching of the polycrystalline silicon film 3 is performed. At this time, because the lower portion of the polycrystalline silicon film 3 is not covered with the silicon oxide film 6, the lower portion of the polycrystalline silicon film 3 is sideetched.

The depth of the recesses M1 is gradually increased while forming the silicon oxide film 6 on the surface of the polycrystalline silicon film 3 that is newly exposed in the recesses M1, so that the shape of the etched polycrystalline silicon film 3 can be controlled accurately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    forming a silicon film, in which an impurity density of a center portion is higher than that of an upper portion and a lower portion, above a base layer;
    forming a mask pattern above the silicon film;
    forming a recess in the silicon film by selectively etching the silicon film through the mask pattern so as to expose a sidewall of the center portion;
    forming a silicon oxide film on a surface of the recess by an oxidation process of the silicon film;
    removing the silicon oxide film formed on the bottom surfaces of the recesses; and
    etching the silicon film under the recess through the mask pattern so as to leave the silicon oxide film on the sidewall at the center portion after the oxidation process.

2. The method according to claim 1, wherein the silicon film under the recess is removed by repeating the forming the silicon oxide film on the surface of the recess and the etching the silicon film under the recess through the mask pattern alternately a plurality of times.

3. The method according to claim 1, wherein both of the following conditions are satisfied:
    $a > b$
    $a > c$
where a is a width of the center portion of the silicon film, b is a width of the upper portion of the silicon film, and c is a width of the lower portion of the silicon film when the silicon film under the recess is removed.

4. The method according to claim 1, wherein the recess is formed to have a depth such that a sidewall of the center portion of the silicon film is exposed.

5. The method according to claim 1, wherein an impurity density profile of the silicon film changes stepwise between the upper portion, the lower portion, and the center portion.

6. The method according to claim 1, wherein an impurity density profile of the silicon film changes continuously between the upper portion, the lower portion, and the center portion.

7. The method according to claim 1, wherein a source gas used when forming the silicon film by a chemical vapor deposition is changed between the upper portion or the lower portion and the center portion in the silicon film.

8. The method according to claim 1, wherein an impurity density in the center portion of the silicon film is made high by ion-implanting an impurity.

9. The method according to claim 1, wherein etching a silicon oxide film on a bottom surface of the recess of the silicon oxide film formed on the surface of the recess and the etching the silicon film under the recess are performed in a same chamber.

10. The method according to claim 1, further comprising forming a trench in the base layer by etching the base layer through the mask pattern after removing the silicon film under the recess.

11. The method according to claim 10, wherein the following condition is satisfied:
    $a' \geq b'$
where a' is a width of the center portion of the silicon film and b' is a width of the upper portion of the silicon film when the trench is formed in the base layer.

12. The method according to claim 10, wherein the base layer includes a semiconductor substrate and a dielectric film formed on the semiconductor substrate.

13. The method according to claim 12, wherein
    the dielectric film forms a tunnel oxide film, and
    the silicon film forms a floating gate electrode.

14. The method according to claim 13, wherein
    the upper portion and the lower portion of the silicon film are formed of a non-doped layer, and
    the center portion of the silicon film is formed of a doped layer.

15. The method according to claim 13, further comprising embedding an isolation dielectric film in the trench.

16. The method according to claim 15, further comprising forming a control gate electrode film on the silicon film via an inter-electrode dielectric film after the embedding the isolation dielectric film in the trench.

17. The method according to claim 12, wherein a silicon oxide film on a sidewall of the recess of the silicon oxide film formed on the surface of the recess is removed when etching the dielectric film in the base layer.

18. The method according to claim 17, wherein the silicon film is side-etched when etching the semiconductor substrate in the base layer.

19. The method according to claim 10, wherein an etching rate of the center portion is higher than that of the upper portion and the lower portion in the silicon film.

20. The method according to claim 19, wherein
    a width of the center portion is larger than that of the upper portion and the lower portion in the silicon film when the silicon film under the recess is removed, and
    the width of the center portion is larger than that of the upper portion in the silicon film when the trench is formed in the base layer.

* * * * *